US010217871B2

(12) United States Patent
Seo et al.

(10) Patent No.: US 10,217,871 B2
(45) Date of Patent: Feb. 26, 2019

(54) METHOD OF CONTROLLING ELECTRIC CONDUCTIVITY OF METAL OXIDE THIN FILM AND THIN FILM TRANSISTOR INCLUDING THE METAL OXIDE FILM HAVING THE CONTROLLED ELECTRIC CONDUCTIVITY

(71) Applicant: Industry-Academic Cooperation Foundation of Ajou University, Suwon-si, Gyeonggi-do (KR)

(72) Inventors: Hyungtak Seo, Seoul (KR); Jin Seo Kim, Seoul (KR); Sang Yeon Lee, Suwon-si (KR)

(73) Assignee: Industry-Academic Cooperation Foundation of Ajou University, Suwon-si (KR)

( * ) Notice: Subject to any disclaimer, the term of this patent is extended or adjusted under 35 U.S.C. 154(b) by 0 days.

(21) Appl. No.: 15/275,795

(22) Filed: Sep. 26, 2016

(65) Prior Publication Data
US 2017/0092772 A1 Mar. 30, 2017

(30) Foreign Application Priority Data

Sep. 25, 2015 (KR) .............................. 2015-0136193

(51) Int. Cl.
| | |
|---|---|
| *H01L 29/786* | (2006.01) |
| *H01L 21/02* | (2006.01) |
| *H01L 29/04* | (2006.01) |
| *H01L 29/22* | (2006.01) |
| *H01L 29/24* | (2006.01) |
| *H01L 29/66* | (2006.01) |

(52) U.S. Cl.
CPC .... *H01L 29/7869* (2013.01); *H01L 21/02554* (2013.01); *H01L 21/02565* (2013.01); *H01L 21/02667* (2013.01); *H01L 29/04* (2013.01); *H01L 29/22* (2013.01); *H01L 29/24* (2013.01); *H01L 29/66969* (2013.01); *H01L 29/78696* (2013.01)

(58) Field of Classification Search
CPC .................................................. H01L 29/7869
USPC ........................................... 257/43; 438/104
See application file for complete search history.

(56) References Cited

U.S. PATENT DOCUMENTS

| | | | | |
|---|---|---|---|---|
| 2007/0170400 A1* | 7/2007 | Chang | ...................... | H01B 1/08 252/500 |
| 2008/0023332 A1* | 1/2008 | Webber | .................... | C25D 5/02 204/510 |

(Continued)

FOREIGN PATENT DOCUMENTS

| | | |
|---|---|---|
| JP | 2015-124117 A | 7/2015 |
| KR | 10-2013-0139915 A | 12/2013 |
| WO | 2011/039853 A1 | 4/2011 |

*Primary Examiner* — Igwe U Anya
(74) *Attorney, Agent, or Firm* — Vorys, Sater, Seymour & Pease LLP; Mih Suhn Koh (57) ABSTRACT

A method for controlling an electric conductivity of a metal oxide thin film is disclosed. The method may include forming a metal oxide thin film; applying thermal treatment to the metal oxide thin film; and irradiating UV (ultraviolet)-rays to the metal oxide thin film in an atmosphere containing water molecules and oxygen molecules. Thus, the hydrogen may be doped into the metal oxide thin film to improve the electric conductivity of the metal oxide thin film.

8 Claims, 11 Drawing Sheets

(56) References Cited

U.S. PATENT DOCUMENTS

| | | | | |
|---|---|---|---|---|
| 2011/0127525 A1* | 6/2011 | Yamazaki | ............ | H01L 29/7869 |
| | | | | 257/43 |
| 2013/0264565 A1* | 10/2013 | Nishimura | ......... | H01L 29/78693 |
| | | | | 257/43 |
| 2014/0145185 A1* | 5/2014 | Ebata | ....................... | C23C 14/08 |
| | | | | 257/43 |
| 2014/0197408 A1* | 7/2014 | Tsuruma | .............. | H01L 29/7869 |
| | | | | 257/43 |
| 2014/0273340 A1* | 9/2014 | Van Duren | ........ | H01L 21/30604 |
| | | | | 438/104 |

* cited by examiner

METHOD OF CONTROLLING ELECTRIC CONDUCTIVITY OF METAL OXIDE THIN FILM AND THIN FILM TRANSISTOR INCLUDING THE METAL OXIDE FILM HAVING THE CONTROLLED ELECTRIC CONDUCTIVITY

CROSS-REFERENCE TO RELATED APPLICATION

This application claims the benefit of Korea patent application No. 10-2015-0136193 filed on Sep. 25, 2015, the entire content of which is incorporated herein by reference for all purposes as if fully set forth herein.

BACKGROUND

Field of the Present Disclosure

The present disclosure relates to a method for improving an electric conductivity of a metal oxide thin film, and a thin film transistor including the metal oxide thin film.

Discussion of Related Art

The metal oxide has been employed for a semiconductor channel of a thin film transistor. The metal oxide has been employed as a transparent electrode for a display device, an energy harvesting device, a touch screen panel, etc.

A pure metal oxide such as an intrinsic two elements-based oxide may have a semiconductor behavior such as an electron movement due to an oxygen vacancy. Thus, the pure metal oxide may not exhibit a high mobility, transparency, reliability. For this reason, extrinsic doping thereto may be used, wherein, for example, impurity metal atoms may be added to the intrinsic two elements-based oxide to form various multi-elements-based metal oxides which are widely employed for applications.

However, the multi-elements-based metal oxides may have difficulty in composition control. Thus, the multi-elements-based metal oxides may have considerable electrical property variations depending on compositions thereof. When the multi-elements-based metal oxides have the non-uniform compositions, they are not applicable to a display area requiring a large area. Further, the multi-elements-based metal oxides may employ expensive transition metals In, Ga, etc. as the extrinsic doped metals. This may increase a product cost. For example, one example of the transparent electrode may include ITO (Indium-Tin Oxide) wherein a price of indium has rapidly risen (currently 600$/kg).

Thus, there is a need for a metal oxide with a large area application without the doped expensive transition metal.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide a method for improving an electric conductivity of a metal oxide thin film, including a hydrogen doping thereto via thermal treatment and UV-ray irradiation, which may realize a metal oxide semiconductor or conductor with large area application.

Further, the present disclosure is to provide a thin film transistor the metal oxide thin film as a channel layer thereof.

In one aspect of the present disclosure, there is provided a method for improving an electric conductivity of a metal oxide thin film, the method comprising: forming a metal oxide thin film; applying thermal treatment to the metal oxide thin film; and irradiating UV (ultraviolet)-rays to the metal oxide thin film in an atmosphere containing water molecules and oxygen molecules.

In one implementation, the metal oxide thin film is one selected from a group of consisting of ZnO, $Ga_2O_3$, $In_2O_3$, $SnO_2$, IZO (Indium Zinc Oxide), SIZO (Silicon Indium Zinc Oxide), HIZO (Hafnium Indium Zinc Oxide), IGZO (Indium Galium Zinc Oxide) and ZTO (Zinc Tin Oxide).

In one implementation, the metal oxide thin film has a thickness in a range of 60 nm to 200 nm, inclusive.

In one implementation, the thermal treatment allows the metal oxide thin film to be crystallized or re-crystallized.

In one implementation, the thermal treatment includes keeping the metal oxide thin film at a temperature equal or higher than 300° C. for a predetermined time, and cooling the metal oxide thin film to a room temperature.

In one implementation, the UV-ray irradiation photo-decomposes the water molecules to produce a hydrogen atom radical which is doped into the metal oxide thin film, thereby to form a metal-OH composite film on a surface of the metal oxide thin film.

In one implementation, the irradiation time of the UV-rays is in a range of 120 mins to 240 mins, inclusive.

In one implementation, the metal-OH composite film has a thickness in a range of 5 nm to 40 nm, inclusive, wherein the metal oxide thin film including the metal-OH composite film has a thickness in a range of 60 nm to 200 nm, inclusive.

In another aspect of the present disclosure, there is provided a thin film transistor including a channel layer to allow electrical connection between source and drain electrodes via a gate voltage, wherein the channel layer include a metal oxide thin film having a metal-OH composite film formed on a surface thereof.

In accordance with the present disclosure, the thermal treatment and UV-ray irradiation may cause the hydrogen doping to the metal oxide thin film to improve the electrical conductivity thereof, may realize a metal oxide semiconductor or conductor with large area application. Further, the hydrogen doping may not (little if any) affect an optical property of the metal oxide thin film, thereby to allow the permanent improvement of the electrical conductivity of the metal oxide thin film without reducing the optical transmittance.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 9A to FIG. 12B illustrate images and EELS (Electron Energy Loss Spectroscopy) measurements for the ZnO thin films just after depositing ZnO, the ZnO thin films subjected only to the thermal treatment after depositing ZnO, the ZnO thin films subjected only to the UV-ray irradiation after depositing ZnO, and the ZnO thin films subjected to both the thermal treatment and UV-ray irradiation after depositing ZnO.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

Figure 1:
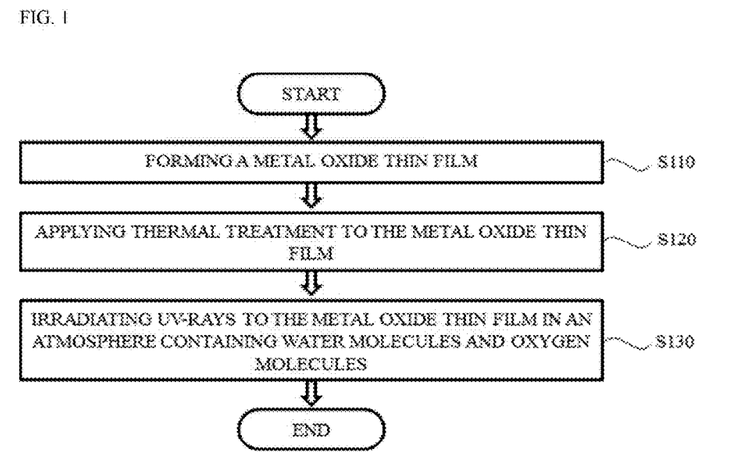
FIG. 1 is a flow chart of a method for improving an electric conductivity of a metal oxide thin film in accordance with one embodiment of the present disclosure.

FIG. 1 is a flow chart of a method for improving an electric conductivity of a metal oxide thin film in accordance with one embodiment of the present disclosure.

Referring to FIG. 1, a method for improving an electric conductivity of a metal oxide thin film in accordance with one embodiment of the present disclosure may include forming a metal oxide thin film on a substrate S110, applying thermal treatment to the metal oxide thin film S120 and irradiating UV (ultraviolet)-rays to the metal oxide thin film in an atmosphere containing water molecules and oxygen molecules S130.

In the forming of the metal oxide thin film on the substrate S110, the metal oxide thin film may be made of two elements-based metal oxides such as ZnO, $Ga_2O_3$, $In_2O_3$, $SnO_2$, etc.; three elements-based metal oxides such as IZO (Indium Zinc Oxide), ZTO (Zinc Tin Oxide), etc.; four elements-based metal oxides such as IGZO (Indium Galium Zinc Oxide), SIZO (Silicon Indium Zinc Oxide), HIZO (Hafnium Indium Zinc Oxide), etc. For example, the metal oxide thin film may be made of ZnO. Further, the metal oxide thin film may at least partially have a poly-crystal structure.

The forming of the metal oxide thin film on the substrate S110 may not be limited to a specific method. For example, the metal oxide thin film may be formed on the substrate using a sputtering, ALD (atomic layer deposition), PLS (pulse laser deposition), etc. or by a solution process using a precursor.

The metal oxide thin film may have a thickness in a range of about 60 nm to about 200 nm inclusive. When the metal oxide thin film has a thickness below 60 nm, an influence of a hydroxyl group formed on the metal oxide thin film by UV-ray irradiation may be very strong, and, thus, an electrical conductivity of the metal oxide thin film may not be improved and/or well-controlled even using the thermal treatment and UV-ray irradiation. When the metal oxide thin film has a thickness above 200 nm, a surface roughness of the metal oxide thin film may increase and bulk defects in the thin film may increase, and, thus, an electrical conductivity of the metal oxide thin film may not be improved even using the thermal treatment and UV-ray irradiation.

The applying of the thermal treatment to the metal oxide thin film S120 may be carried out at a temperature at which the metal oxide thin film is crystallized or recrystallized. The applying of the thermal treatment to the metal oxide thin film S120 may minimize defects formed in the metal oxide thin film in the forming of the metal oxide thin film on the substrate S110. Thus, the minimized defects may improve hydrogen doping efficiency by subsequent UV-ray irradiation. For example, when the metal oxide thin film has a poly-crystal structure, the thermal treatment may increase a grain size of the metal oxide thin film and may allow re-crystallization thereof in a direction at which a distance between crystal faces decreases. The grain size of the resulting metal oxide thin film may be in a range of several nanometers (nm) to several tens micrometers (μm).

In one embodiment, the thermal treatment for the metal oxide thin film may be carried out at a thermal treatment temperature above about 200° C., more preferably, above about 300° C. The thermal treatment for the metal oxide thin film may be carried out by raising the temperature of the metal oxide thin film to the thermal treatment temperature at a constant speed, keeping the metal oxide thin film at the thermal treatment temperature for a predetermined time, and, then, slowly cooling the metal oxide thin film to a room temperature in an air. The thermal treatment time may be not limited to a specific time. For example, the metal oxide thin film may be kept at the thermal treatment temperature for about 5 to 60 mins.

The irradiation of UV-rays to the metal oxide thin film in the water vapor ($H_2O$) and oxygen ($O_2$) containing atmosphere S130 may allow hydrogens to be doped into a surface and/or inner portion of the metal oxide thin film may allow an oxygen vacancy to be formed in a surface of the metal oxide thin film.

The irradiation of UV-rays to the metal oxide thin film in the water vapor ($H_2O$) and oxygen ($O_2$) containing atmosphere may photo-decompose water molecules $H_2O$ to produce a hydrogen radical, which, in turn, may invade into the surface of the metal oxide thin film in which the radical may react with an oxygen ion in a lattice in the metal oxide thin film to form a 'metal-OH composite film' in the surface of the metal oxide thin film. For example, the hydrogen radical in the surface of the metal oxide thin film may react with an oxygen ion ($O^{2-}$) bonded to a metal in a lattice in the metal oxide thin film to form a hydroxyl ion ($OH^-$) and an electron ($e^-$). As a result, a density of a free electron in the metal oxide thin film may increase. Meanwhile, an activated oxygen atom formed by the UV-ray irradiation may react with an oxygen ion in a lattice in the metal oxide thin film to form an oxygen vacancy. In this way, the free electron increase and oxygen vacancy formation may increase the electrical conductivity of the metal oxide thin film. Further, the hydrogen atom radical may form the metal-OH composite in the metal oxide thin film surface, thereby to protect a surface dangling bond, and, thus, to reduce surface carrier trapping in the metal oxide thin film.

In one embodiment, the UV-rays may be irradiated for about 60 mins. When the UV-ray irradiation time is below 60 mins, hydrogen atoms invaded into the metal oxide thin film may be small, thereby not to improve the electrical conductivity of the metal oxide thin film. In one embodiment, the UV-rays may be irradiated for a time in a range of about 60 mins to about 240 mins inclusive. When the UV-rays irradiation time is above 240 mins, further UV-rays irradiation may not lead to further increase of the electrical conductivity of the metal oxide thin film.

In accordance with the present disclosure, the electrical conductivity of the metal oxide thin film may be improved due the hydrogen doping by the thermal treatment and UV-ray irradiation, thereby to produce a large-sized metal oxide semiconductor or conductor with a low cost. Further, the hydrogen doping may not affect an optical property of the metal oxide thin film, thereby to achieve permanent increase of the electrical conductivity of the metal oxide thin film without reduction of an optical transmittance.

In one embodiment of the present disclosure, the metal oxide thin film may be used for a channel for the thin film transistor.

Figure 2:
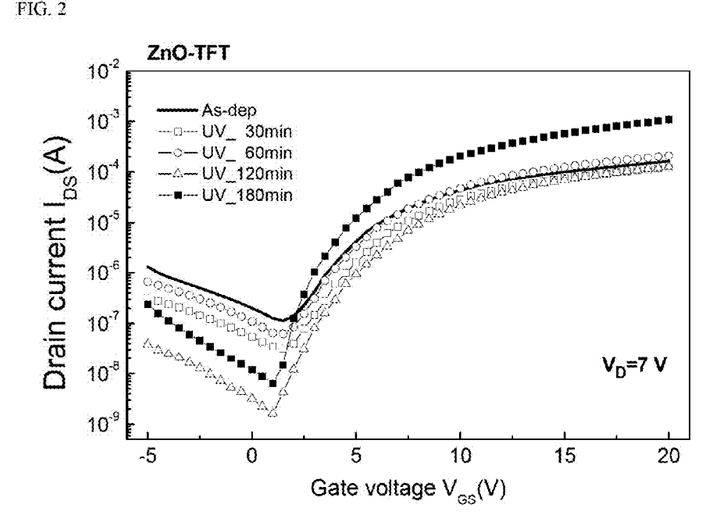
FIG. 2 is a graph of a drain current over a gate voltage for a thin film transistor including a ZnO thin film as a channel thereof.

FIG. 2 is a graph of a drain current over a gate voltage for a thin film transistor including a ZnO thin film as a channel thereof.

Referring to FIG. 2, compared to a case 1 (as-dep') that ZnO is deposited as a channel of a thin film transistor, and, thereafter, UV-rays radiation is not performed, a case 2 (UV_30 min') that ZnO is deposited as a channel of a thin film transistor, and, thereafter, UV-rays radiation is performed for 30 mins, and a case 3 (UV_60 min') that ZnO is deposited as a channel of a thin film transistor, and, thereafter, UV-rays radiation is performed for 60 mins, a case 4 (UV 120 min') that ZnO is deposited as a channel of a thin film transistor, and, thereafter, UV-rays radiation is performed for 120 mins, and a case 5 (UV_180 min) that ZnO is deposited as a channel of a thin film transistor, and, thereafter, UV-rays radiation is performed for 180 mins may have increase in an on/off ratio of the transistor by about $10^2$, and, at the same time, have increase in an on-current of a drain current and have decrease in an off-current thereof.

Further, between the case 4 (UV_120 min') that ZnO is deposited as a channel of a thin film transistor, and, thereafter, UV-rays radiation is performed for 120 mins, and the case 5 (UV_180 min') that ZnO is deposited as a channel of a thin film transistor, and, thereafter, UV-rays radiation is performed for 180 mins, the on/off ratios of the transistors may be substantially equal to each other. However, compared to the case 5, the case 4 has decrease in a leak current due to the decrease in an off-current but also decrease in an on-current of the drain current.

That is, when the ZnO is subjected to the UV-rays irradiation to form the channel for the thin film transistor, it may be preferable that the UV-rays radiation time is above about 2 hours.

Hereinafter, specific embodiments of the present disclosure will be described. The following specific embodiments of the present disclosure may be merely examples of the present disclosure. Thus, the present disclosure may not be limited to the following embodiments.

Embodiment 1 and Comparison

ZnO thin films with 20 nm thickness are formed on silicon wafers with a $SiO_2$ coating with about 285 nm thickness in a vacuum chamber using a RF plasma sputtering method.

Using RTA (Rapid Thermal Annealing), the ZnO thin films are subjected to the thermal treatments with varying thermal treatment temperatures and thermal treatment times. The thermal treatment may be carried out by keeping the vacuum state for 15 mins using a rotary pump, raising the ZnO thin films to the thermal treatment temperature, keeping the ZnO thin films at the thermal treatment temperature for the above-defined time, and, then, slowly cooling the ZnO thin films to a room temperature in an air.

Further, in order to identify an influence of the thermal treatment on the electrical property of the ZnO thin film, some of the ZnO thin films are not subjected to the thermal treatment.

Then, UV-rays with an output and frequency 1000 W and 285 nm are irradiated, using the UV lamp, to the ZnO thin films subjected to the thermal treatment and the ZnO thin films not subjected to the thermal treatment respectively. Specifically, the UV lamp is spaced from the ZnO thin films by about 1 mm and, then, UV-rays are irradiated to the ZnO thin films in a water vapor and oxygen containing atmosphere for varying irradiation times. In this connection, in order to prevent the ZnO thin films from being overheated by the UV-rays, a fan is used for inner ventilation during the UV-rays irradiation.

Example: Electrical Property

Figure 3:
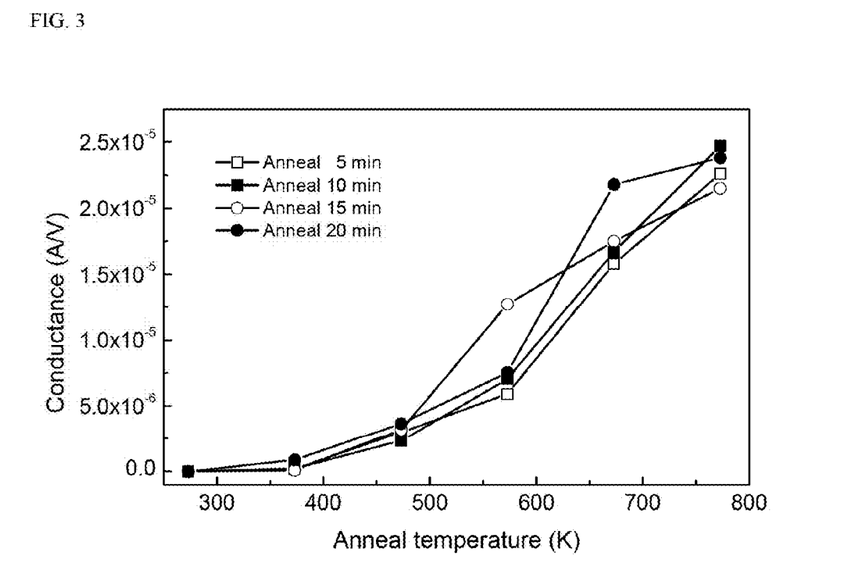
FIG. 3 is a graph of an electric conductivity of a ZnO thin film over a thermal treatment temperature and thermal treatment time.

FIG. 3 is a graph of an electric conductivity of a ZnO thin film over a thermal treatment temperature and thermal treatment time.

Referring to FIG. 3, a change of an electric conductivity of a ZnO thin film over a thermal treatment time is relatively small. However, the thermal treatment temperature may greatly affect the electric conductivity of the ZnO thin film. Specifically, when the thermal treatment temperature is below 200° C., the electric conductivity of the ZnO thin film has no substantial change. When the thermal treatment temperature is higher than or equal to 200° C., the electric conductivity of the ZnO thin film considerably changes over the thermal treatment temperature.

Thus, it may be preferable that the thermal treatment temperature is higher than or equal to 200° C. It may be more preferable that the thermal treatment temperature is higher than or equal to 300° C.

Figure 4:
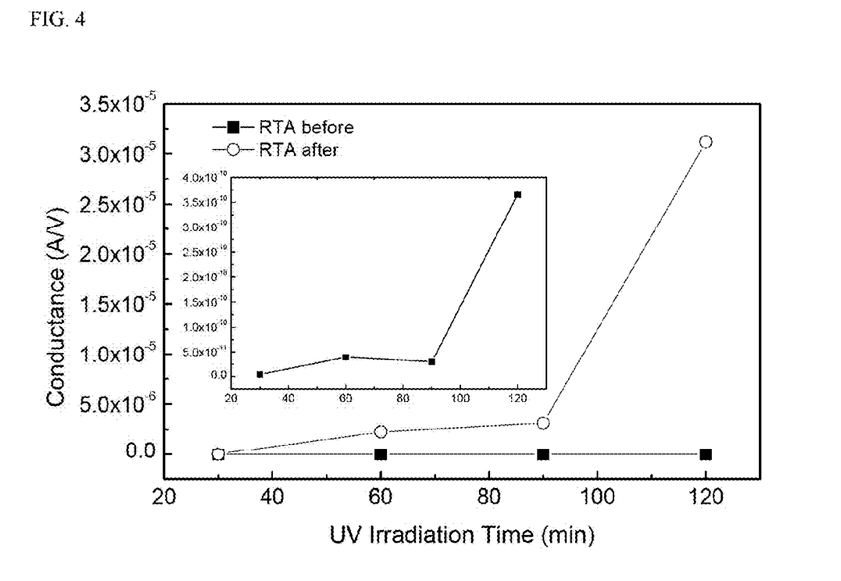
FIG. 4 is a graph of electric conductivities of ZnO thin films subject to the thermal treatment and ZnO thin films not subject to the thermal treatment over an UV-ray irradiation time.

FIG. 4 is a graph of electric conductivities of ZnO thin films subject to the thermal treatment and ZnO thin films not subject to the thermal treatment over an UV-ray irradiation time.

Referring to FIG. 4, the ZnO thin films not subject to the thermal treatment have a slight change in the electrical conductivity thereof even using the UV-rays irradiation. Such a change may be similar to that for an insulating material. To the contrary, the ZnO thin films subject to the thermal treatment have rapid increases in the electric conductivities thereof using the UV-rays irradiation for more than 90 mins. Thus, the thermal treatment for the metal oxide thin film may improve the hydrogen doping to allow the improvement in the electric conductivity of the metal oxide thin film. As for the ZnO thin films subject to the thermal treatment, in order to improve the electrical conductivity of the metal oxide thin film as much as the increase level in the electrical conductivity of the semiconductor or conductor, it may be preferable that the UV-ray irradiation time is equal to or larger than 90 mins.

Embodiment 2 and Comparison

ZnO thin films with 20 nm, 40 nm, 60 nm, 80 nm, 100 nm and 120 nm thicknesses are formed on silicon wafers with a $SiO_2$ coating with about 285 nm thickness in a vacuum chamber using a RF plasma sputtering method. The resultant product is subject to the thermal treatment at 500° C. for 5 mins. Then, UV-rays with an output and frequency 1000 W and 285 nm are irradiated, using the UV lamp, to the ZnO thin films subjected to the thermal treatment for 2 hours. In this connection, the UV lamp is spaced from the ZnO thin films by about 1 mm and, then, UV-rays are irradiated to the ZnO thin films.

Example: Electrical, Optical and Chemical Properties

Figure 5:
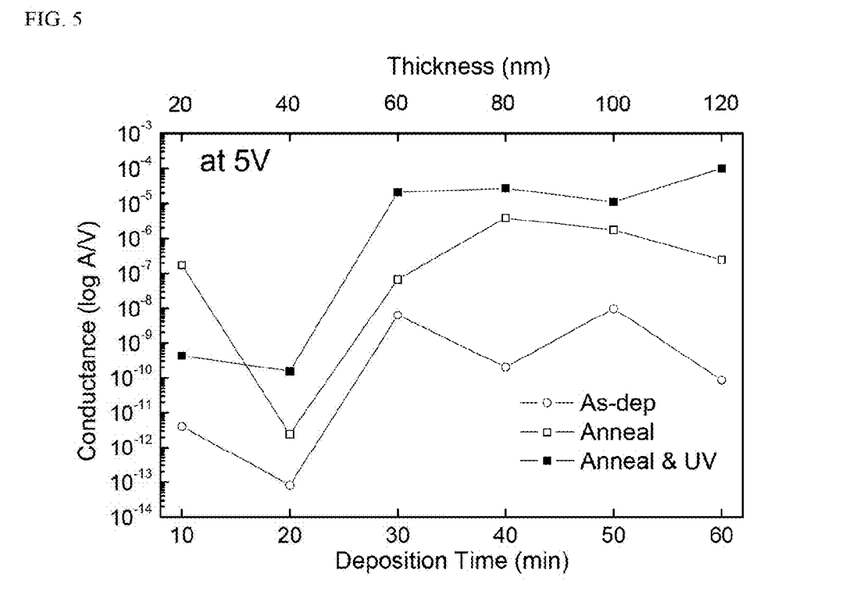
FIG. 5 is a graph of electric conductivities of the ZnO thin films over thicknesses thereof.

FIG. 5 is a graph of electric conductivities of the ZnO thin films over thicknesses thereof.

In FIG. 5, a 'black curve' indicates an electrical conductivity of ZnO thin films just after depositing ZnO; a 'red curve' indicates an electrical conductivity of ZnO thin films subjected only to the thermal treatment after depositing ZnO; and a 'blue curve' indicates an electrical conductivity of ZnO thin films subjected to both the thermal treatment and UV-ray irradiation after depositing ZnO.

Referring to FIG. 5, compared to the ZnO thin films just after depositing ZnO, and the ZnO thin films subjected only to the thermal treatment after depositing ZnO, the ZnO thin films subjected to both the thermal treatment and UV-ray irradiation after depositing ZnO may have remarkably increased electrical conductivity.

Among the ZnO thin films subjected to both the thermal treatment and UV-ray irradiation after depositing ZnO, the ZnO thin films having a thickness below 60 nm may have the electrical conductivity which has a large variation as the thin film thickness changes; but, the ZnO thin films having a thickness larger than or equal to 60 nm may have the high electrical conductivity, which has a small variation as the thin film thickness changes.

Thus, it may be preferable that the metal oxide thin film has a thickness larger than or equal to 60 nm.

Figure 6A:
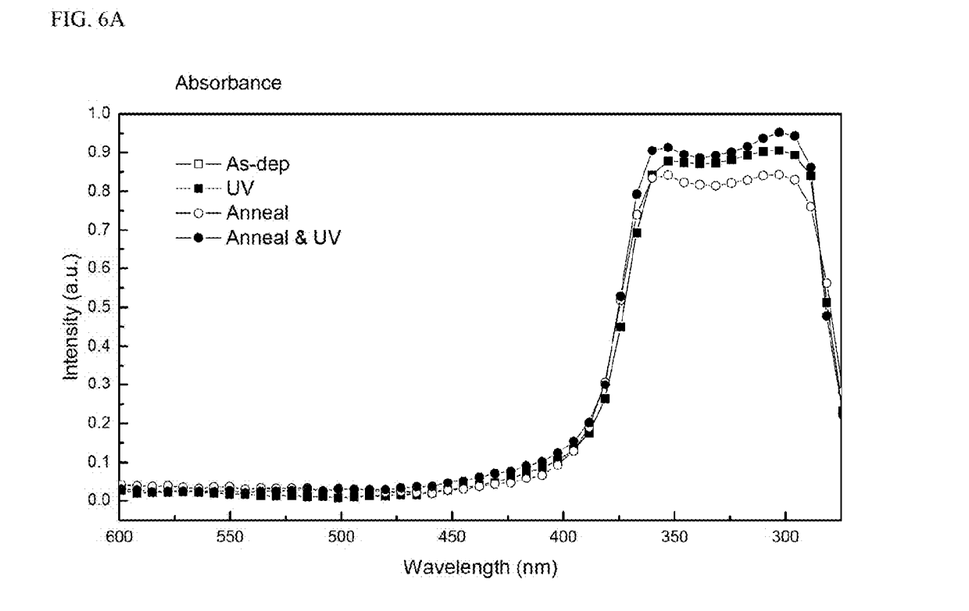
FIG. 6A is a graph of light absorbance of ZnO thin films just after depositing ZnO, ZnO thin films subjected only to the thermal treatment after depositing ZnO, and ZnO thin films subjected to both the thermal treatment and UV-ray irradiation after depositing ZnO.

FIG. 6A is a graph of light absorbance of ZnO thin films just after depositing ZnO, ZnO thin films subjected only to the thermal treatment after depositing ZnO, and ZnO thin films subjected to both the thermal treatment and UV-ray irradiation after depositing ZnO.

Figure 6B:
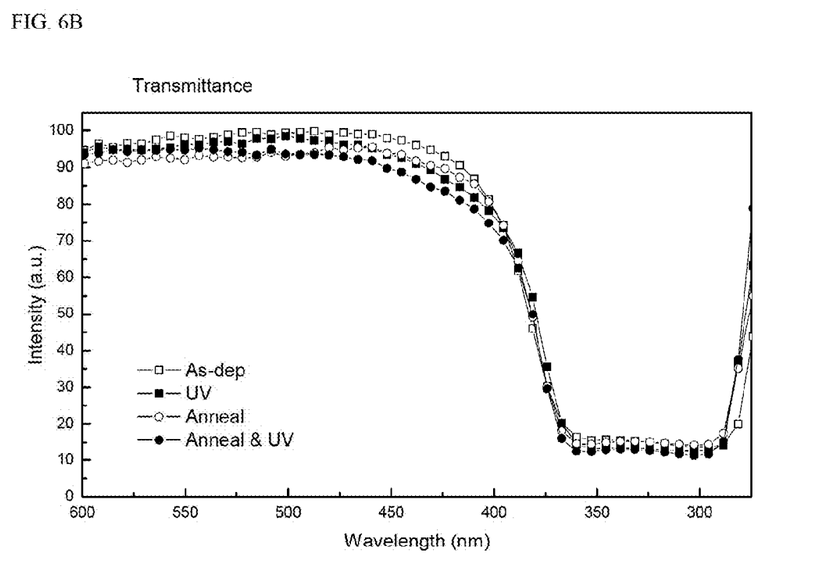
FIG. 6B is a graph of light transmittance of ZnO thin films just after depositing ZnO, ZnO thin films subjected only to the thermal treatment after depositing ZnO, and ZnO thin films subjected to both the thermal

FIG. 6B is a graph of light transmittance of ZnO thin films just after depositing ZnO, ZnO thin films subjected only to the thermal treatment after depositing ZnO, and ZnO thin films subjected to both the thermal treatment and UV-ray irradiation after depositing ZnO.

Referring to FIG. 6A and FIG. 6B, all of the ZnO thin films just after depositing ZnO, the ZnO thin films subjected only to the thermal treatment after depositing ZnO, and the ZnO thin films subjected to both the thermal treatment and UV-ray irradiation after depositing ZnO have the similar light transmittance and absorbance.

Thus, the hydrogen doping may not (little if any) affect an optical bandgap of the thin film. In this way, in accordance with the present disclosure, the metal oxide thin film with high light transmittance and high electrical conductivity may be achieved.

Figure 7A:
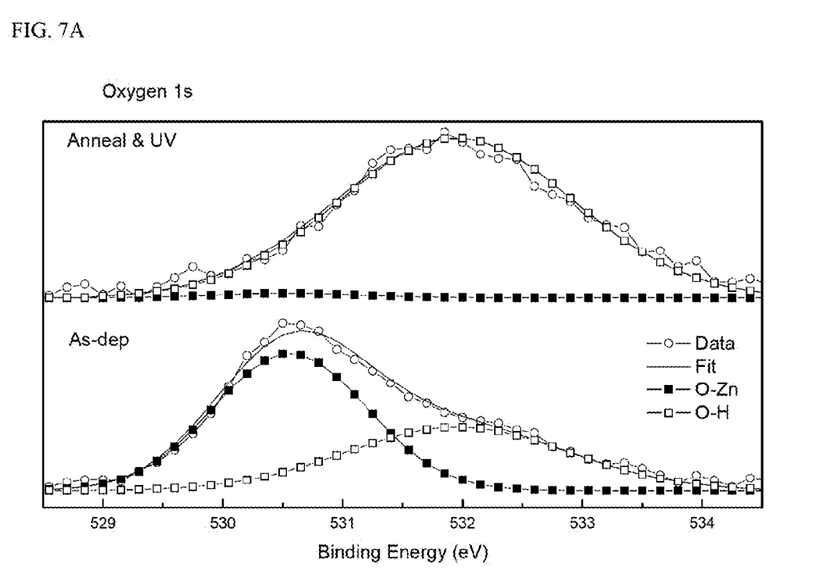
FIG. 7A and FIG. 7B are graphs showing XPS measurements of ZnO thin films just after depositing ZnO, and ZnO thin films subjected to both the thermal treatment and UV-ray irradiation after depositing ZnO.
Figure 7B:
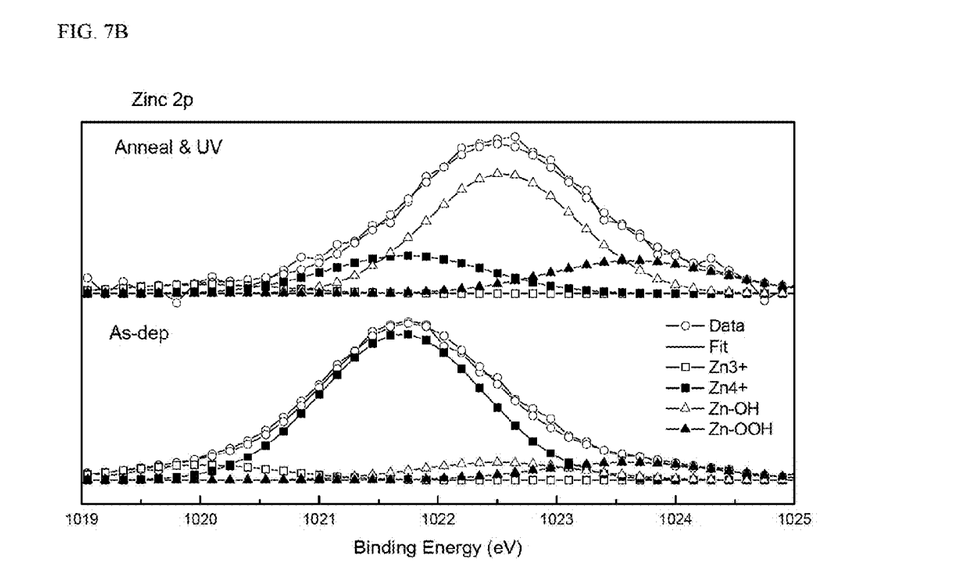

FIG. 7A and FIG. 7B are graphs showing XPS measurements of ZnO thin films just after depositing ZnO, and ZnO thin films subjected to both the thermal treatment and UV-ray irradiation after depositing ZnO.

Referring to FIG. 7A, in term of oxygens, for the ZnO thin films just after depositing ZnO, 'O—Zn' bonds are main; for the ZnO thin films subjected to both the thermal treatment and UV-ray irradiation after depositing ZnO, 'O—H' bonds are main.

Referring to FIG. 7B, in terms of zincs, for the ZnO thin films just after depositing ZnO, '$Zn^{4+}$' bonds are main, and '$Zn^{3+}$' bond, 'Zn—OH' bond, 'Zn—OOH' bond, etc. are merely present; for the ZnO thin films subjected to both the thermal treatment and UV-ray irradiation after depositing ZnO, 'Zn—OH' bonds are main and '$Zn^{4+}$' bonds are merely present.

From the above fact, it is confirmed that the UV-ray irradiation may cause the hydrogen doping to allow the bond between the hydrogen and oxygen to be formed in the ZnO thin film.

Figure 8A:
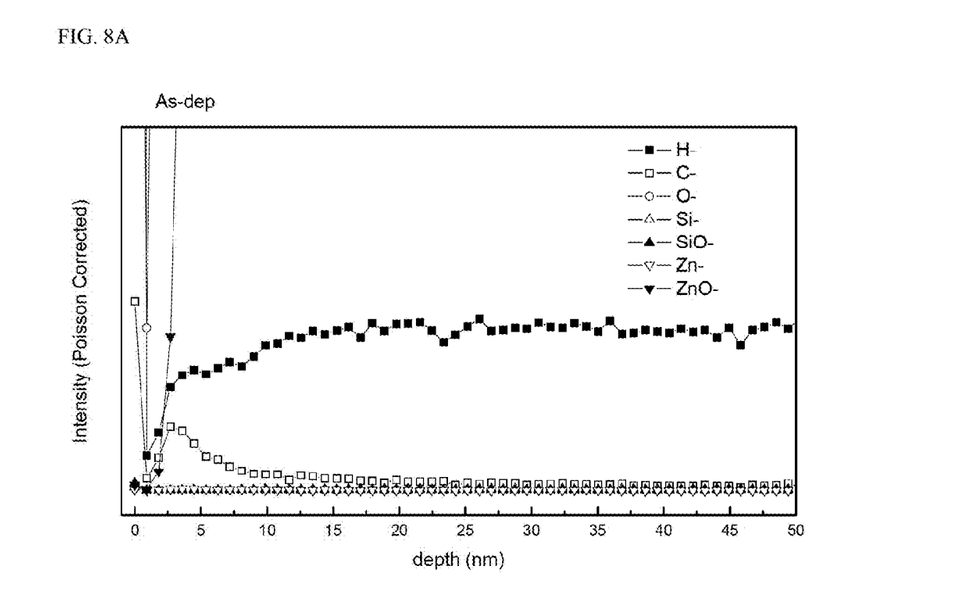
FIG. 8A to FIG. 8C are graphs of elements distributions over thin film depths for the ZnO thin films just after depositing ZnO, the ZnO thin films subjected only to the thermal treatment after depositing ZnO, and the ZnO thin films subjected to both the thermal treatment and UV-ray irradiation after depositing ZnO.
Figure 8B:
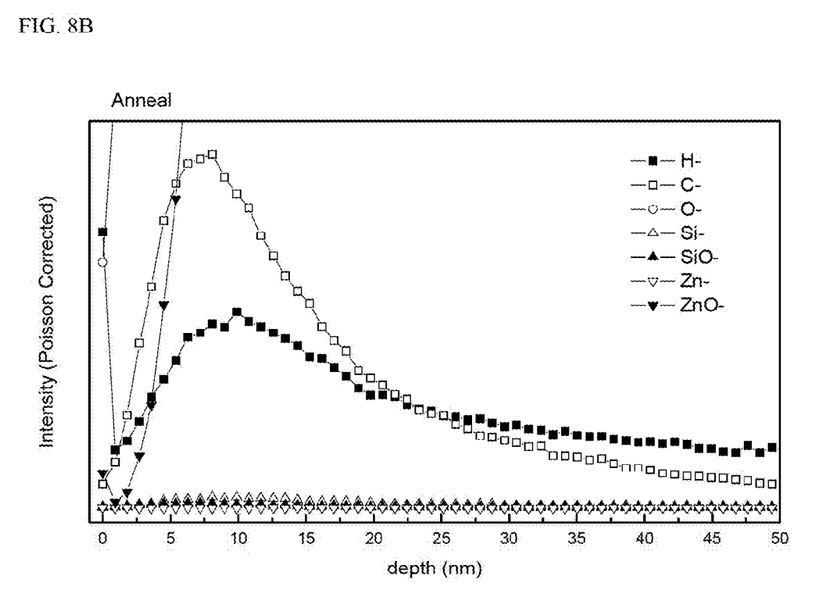
Figure 8C:
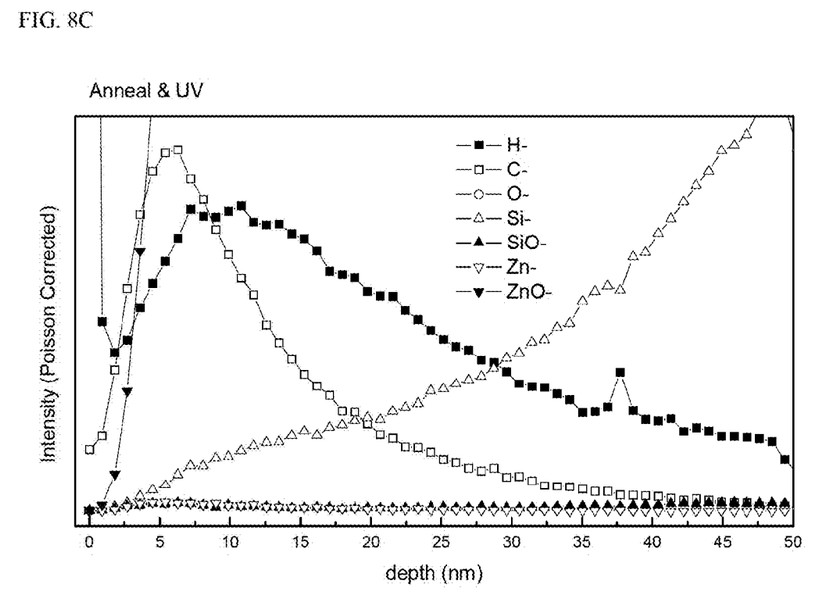

FIG. 8A to FIG. 8C are graphs of elements distributions over thin film depths for the ZnO thin films just after depositing ZnO, the ZnO thin films subjected only to the thermal treatment after depositing ZnO, and the ZnO thin films subjected to both the thermal treatment and UV-ray irradiation after depositing ZnO.

Figure 8D:
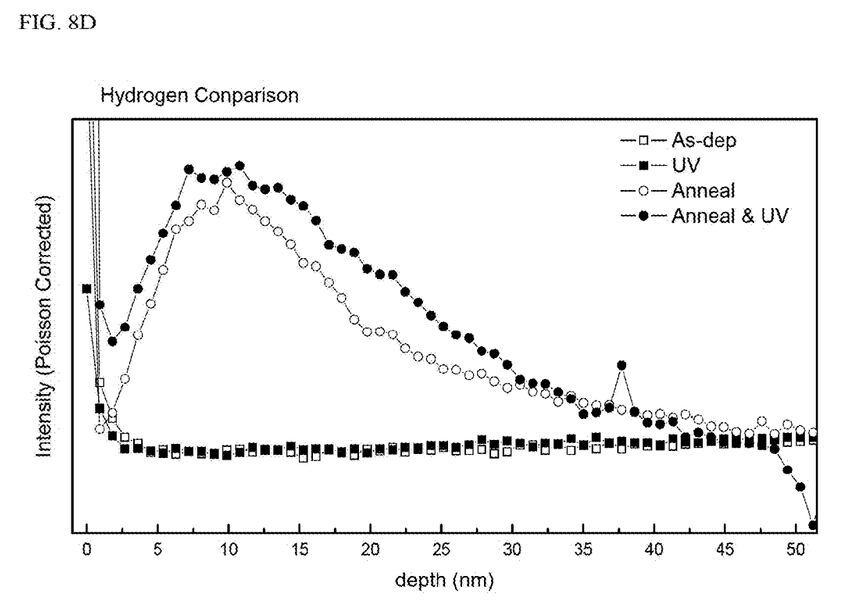
FIG. 8D is a graph of hydrogen distribution over thin film depths for the ZnO thin films just after depositing ZnO, the ZnO thin films subjected only to the thermal treatment after depositing ZnO, the ZnO thin films subjected only to the UV-ray irradiation after depositing ZnO, and the ZnO thin films subjected to both the thermal treatment and UV-ray irradiation after depositing ZnO.
Figure 9A:
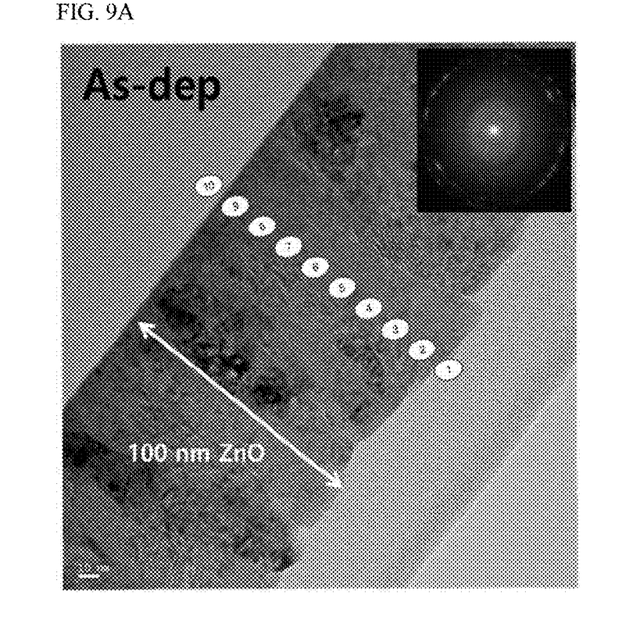
Figure 9B:
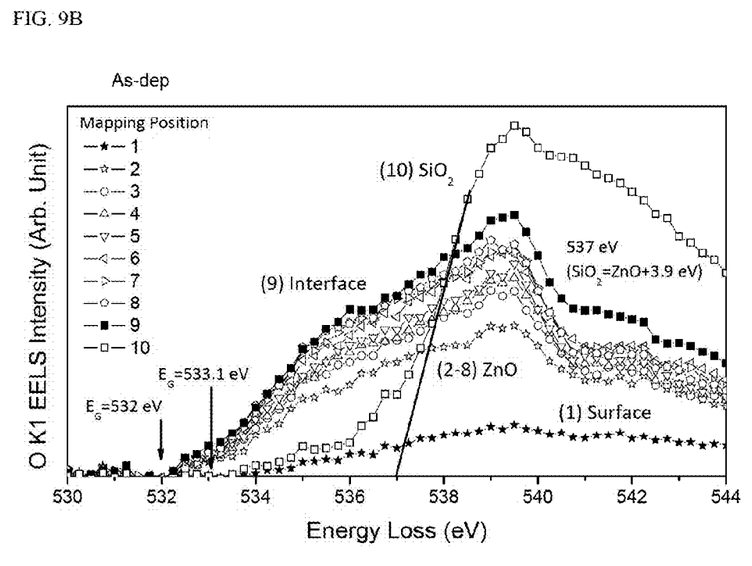
Figure 10A:
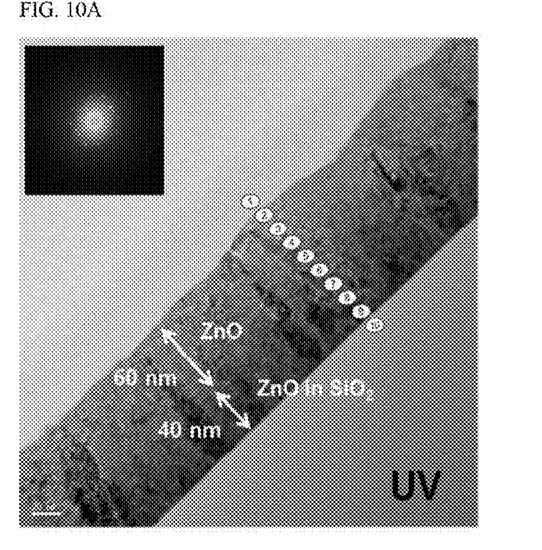
Figure 10B:
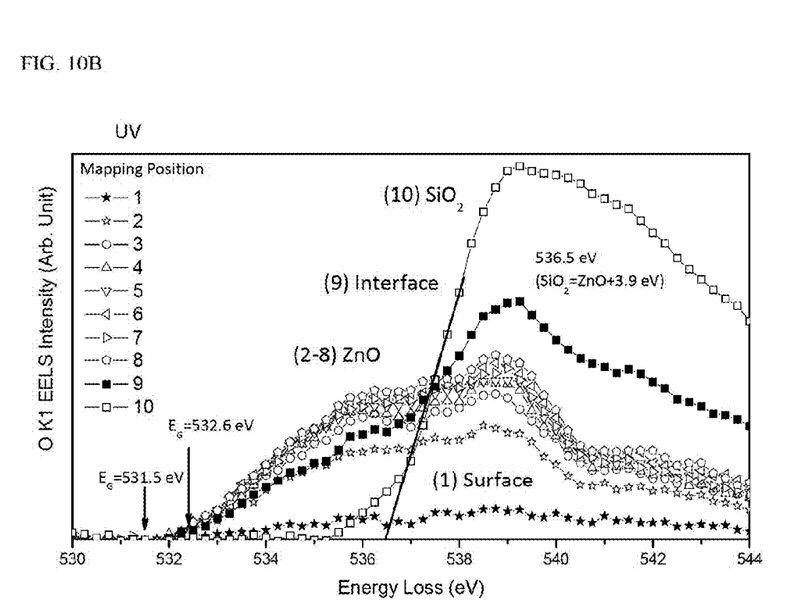
Figure 11A:
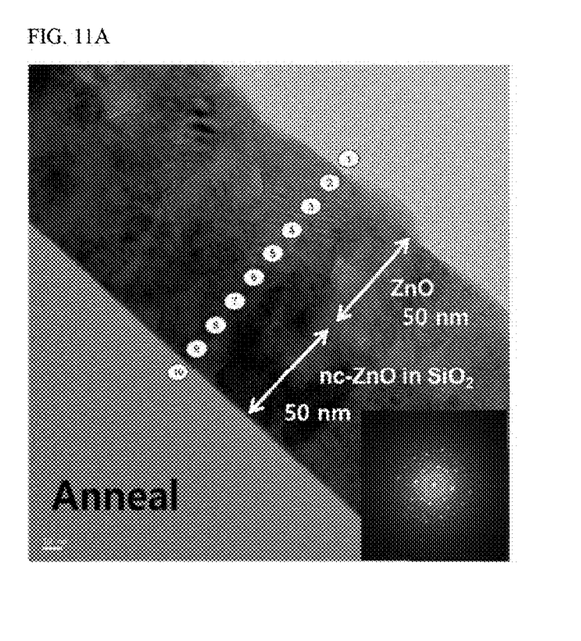
Figure 11B:
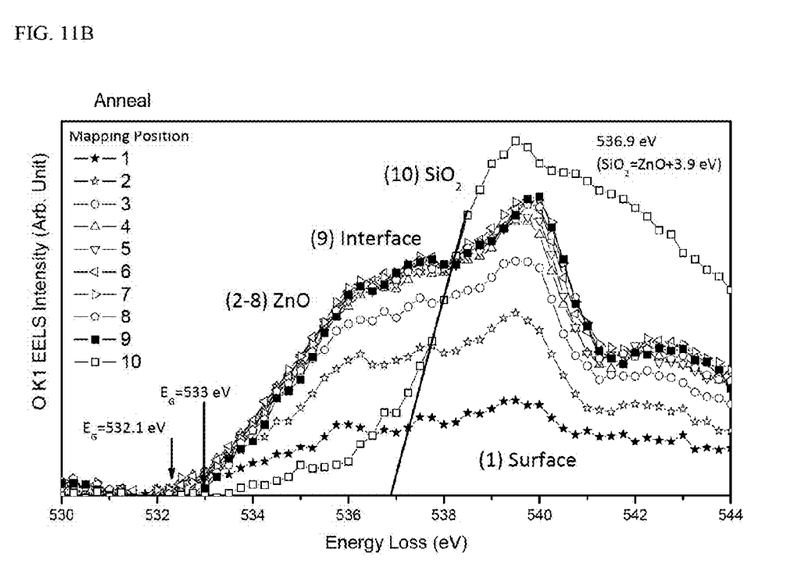
Figure 12A:
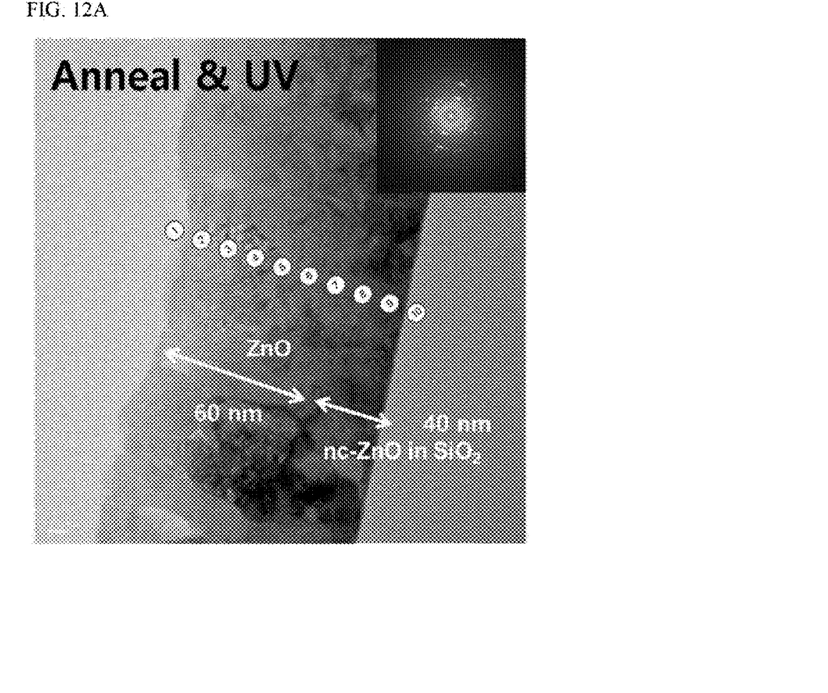
Figure 12B:
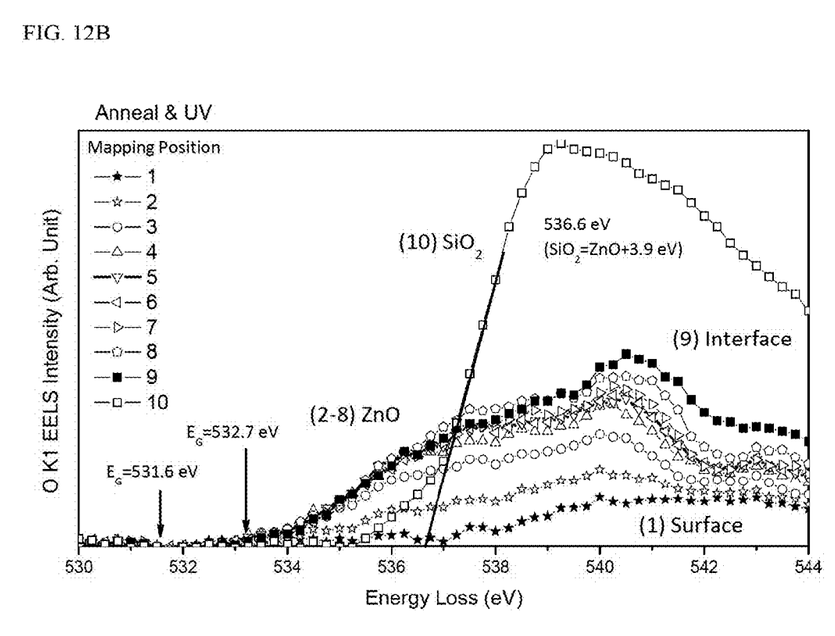

FIG. 8D is a graph of hydrogen distribution over thin film depths for the ZnO thin films just after depositing ZnO, the ZnO thin films subjected only to the thermal treatment after depositing ZnO, the ZnO thin films subjected only to the UV-ray irradiation after depositing ZnO, and the ZnO thin films subjected to both the thermal treatment and UV-ray irradiation after depositing ZnO.

Referring to FIG. 8A to FIG. 8C, compared to the ZnO thin films just after depositing ZnO, the ZnO thin films subjected only to the thermal treatment after depositing ZnO, the hydrogen amount in the thin film surface may more increase. This is because the thermal treatment may allow the ZnO thin film to be re-crystallized, and, thus, spaces for the hydrogen invasion may be formed, and, further, some hydrogens in the air may diffuse into the thin film surface. Compared to the ZnO thin films subjected only to the thermal treatment after depositing ZnO, the ZnO thin films subjected to both the thermal treatment and UV-ray irradiation after depositing ZnO, the hydrogen amount in the thin film surface may more increase. This is because the UV-ray irradiation may cause the hydrogen radical which may be invaded into the thin film surface.

Referring to FIG. 8D, the hydrogen distribution for the ZnO thin films subjected only to the UV-ray irradiation after depositing ZnO may be substantially the same as the hydrogen distribution for the ZnO thin films just after depositing ZnO. For the ZnO thin films subjected to both the thermal treatment and UV-ray irradiation after depositing ZnO, the hydrogen amount in the thin film surface, that is, within a depth in a range of 5 nm to 40 nm, inclusive remarkably increases.

FIG. 9A to FIG. 12B illustrate images and EELS (Electron Energy Loss Spectroscopy) measurements for the ZnO thin films just after depositing ZnO, the ZnO thin films subjected only to the thermal treatment after depositing ZnO, the ZnO thin films subjected only to the UV-ray irradiation after depositing ZnO, and the ZnO thin films subjected to both the thermal treatment and UV-ray irradiation after depositing ZnO.

Referring to FIG. 9A to FIG. 12B, the thin films subjected only to the thermal treatment after depositing ZnO, and the ZnO thin films subjected to both the thermal treatment and UV-ray irradiation after depositing ZnO may have the same directional crystal property as that for the ZnO thin films just after depositing ZnO, having the poly-crystal structure. However, compared to the ZnO thin films just after depositing ZnO, the thin films subjected only to the thermal treatment after depositing ZnO, and the ZnO thin films subjected to both the thermal treatment and UV-ray irradiation after depositing ZnO may have more increase in a grain area. The TEM measurements show a distance between crystal faces (d-space) in the surface of the ZnO thin film. From the TEM measurements, the d-space for the ZnO thin films just after depositing ZnO is 5.3 nm; all of the d-spaces for the thin films subjected only to the thermal treatment after depositing ZnO and the ZnO thin films subjected to both the thermal treatment and UV-ray irradiation after depositing ZnO are 5.1 nm. From this fact, it is confirmed that the thermal treatment may cause the re-crystallization in the ZnO thin film surface.

Further, compared to the ZnO thin films subjected only to the UV-ray irradiation after depositing ZnO, the ZnO thin films subjected to both the thermal treatment and UV-ray irradiation after depositing ZnO may have a gradually twisted crystal direction in the surface thereof. This may indicate that more hydrogens may be doped into the changed crystal structure due to the re-crystallization.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method of improving an electric conductivity of a metal oxide thin film for a large area application, the method comprising:
   forming a metal oxide thin film which is insulative;
   applying thermal treatment to the metal oxide thin film so that the metal oxide thin film has a poly-crystalline structure; and
   after the thermal treatment, irradiating UV-rays to the metal oxide thin film having the poly-crystalline structure in an atmosphere containing water molecules and oxygen molecules, forming a metal-OH composite film on a surface of the metal oxide thin film,
   wherein the metal oxide thin film having the metal-OH composite film is conductive or semiconductive.

2. The method of claim 1, wherein the metal oxide thin film comprises one or more selected from the group of consisting of ZnO, $Ga_2O_3$, $In_2O_3$, $SnO_2$, IZO (Indium Zinc Oxide), SIZO (Silicon Indium Zinc Oxide), HIZO (Hafnium Indium Zinc Oxide), IGZO (Indium Galium Zinc Oxide), and ZTO (Zinc Tin Oxide).

3. The method of claim 1, wherein the metal oxide thin film has a thickness in a range of 60 nm to 200 nm.

4. The method of claim 1, wherein the thermal treatment allows the metal oxide thin film to be crystallized or re-crystallized.

5. The method of claim 4, wherein the thermal treatment comprises keeping the metal oxide thin film at a temperature equal or higher than 300° C. for a predetermined first time, and slowly cooling the metal oxide thin film to a room temperature.

6. The method of claim 1, wherein the UV-ray irradiation photo-decomposes the water molecules to produce a hydrogen atom radical which is doped into the metal oxide thin film, thereby to form a metal-OH composite film on a surface of the metal oxide thin film.

7. The method of claim 6, wherein the irradiation time of the UV-rays is in a range of 120 mins to 240 mins.

8. The method of claim 6, wherein the metal-OH composite film has a thickness in a range of 5 nm to 40 nm, and a total thickness of the metal oxide thin film including the metal-OH composite film is in a range of 60 nm to 200 nm.

* * * * *